US012810917B2

(12) United States Patent
Sasmal et al.

(10) Patent No.: US 12,810,917 B2
(45) Date of Patent: Nov. 24, 2026

(54) ARRAY VOLTAGE BIAS GENERATOR

(71) Applicant: Micron Technology, Inc., Boise, ID (US)

(72) Inventors: Subhasis Sasmal, Hyderabad (IN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 18/929,175

(22) Filed: Oct. 28, 2024

(65) Prior Publication Data

US 2025/0273256 A1 Aug. 28, 2025

Related U.S. Application Data

(60) Provisional application No. 63/557,915, filed on Feb. 26, 2024.

(51) Int. Cl.

| | |
|---|---|
| ***G11C 11/4074*** | (2006.01) |
| ***G11C 5/14*** | (2006.01) |
| ***G11C 7/04*** | (2006.01) |

(52) U.S. Cl.

CPC .......... *G11C 11/4074* (2013.01); *G11C 5/147* (2013.01); *G11C 7/04* (2013.01)

(58) Field of Classification Search

CPC .. G05F 3/205; H02M 3/158; G11C 11/24074; G11C 5/147; G11C 7/04

See application file for complete search history.

(56) References Cited

U.S. PATENT DOCUMENTS

2019/0369654 A1* 12/2019 Wan .......................... G05F 3/205
2023/0005521 A1* 1/2023 Joshi ........................ G11C 7/067

* cited by examiner

*Primary Examiner* — Woo H Choi
(74) *Attorney, Agent, or Firm* — Fletcher Yoder, P.C.

(57) ABSTRACT

An electronic device, such as a memory device, may include various circuit components. A memory array of the memory device may be powered via a power distribution network. Over time, loading of voltage regulators may change based on demand of the power distribution network. By including a bias voltage generator to supply the voltage regulators with a compensated bias current, voltages generated by the voltage regulators may be better compensated over temperature and process changes. Voltage regulators that generate relatively more compensated voltages may experience improved matching on transient performance. For example, a Slow process corner transient response may relatively match a Fast process corner transient response (e.g., within a threshold range of difference).

20 Claims, 6 Drawing Sheets

ARRAY VOLTAGE BIAS GENERATOR

CROSS-REFERENCE TO RELATED APPLICATIONS

This application claims priority to U.S. Provisional Application No. 63/557,915, filed Feb. 26, 2024, which is incorporated by reference herein in its entirety.

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following generally relates to electronic devices and, more specifically, to voltage testing circuits used in various electronic devices. An electronic device may include a memory device, a processing device, and routing circuitry, among other things. For example, the memory device may include a number of memory arrays including memory cells, a row decoder, and a column decoder, among other memory components, to perform memory operations including memory read and write operations. Moreover, various circuit components of the electronic device, including the memory components, may provide one or more signals for performing the memory operations.

The electronic device may also include one or more voltage generation circuits, such as an array voltage generator, to generate voltages to be sent to a memory array of the memory device. The array voltage generator may receive a bias current ($I_{OUT}$) (e.g., a tail current) from a regulator circuit. In some cases, the bias current ($I_{OUT}$) generated by the regulator circuit may vary undesirably as process and/or temperature changes and/or have slow transient performance in response to load changes (e.g., a memory array once refreshing has since stopped or paused the refresh, changing/reducing, temporarily, its power consumed).

BRIEF DESCRIPTION OF THE DRAWINGS

Various aspects of this disclosure may be better understood upon reading the following detailed description and upon reference to the drawings in which.

DETAILED DESCRIPTION

Figure 1:
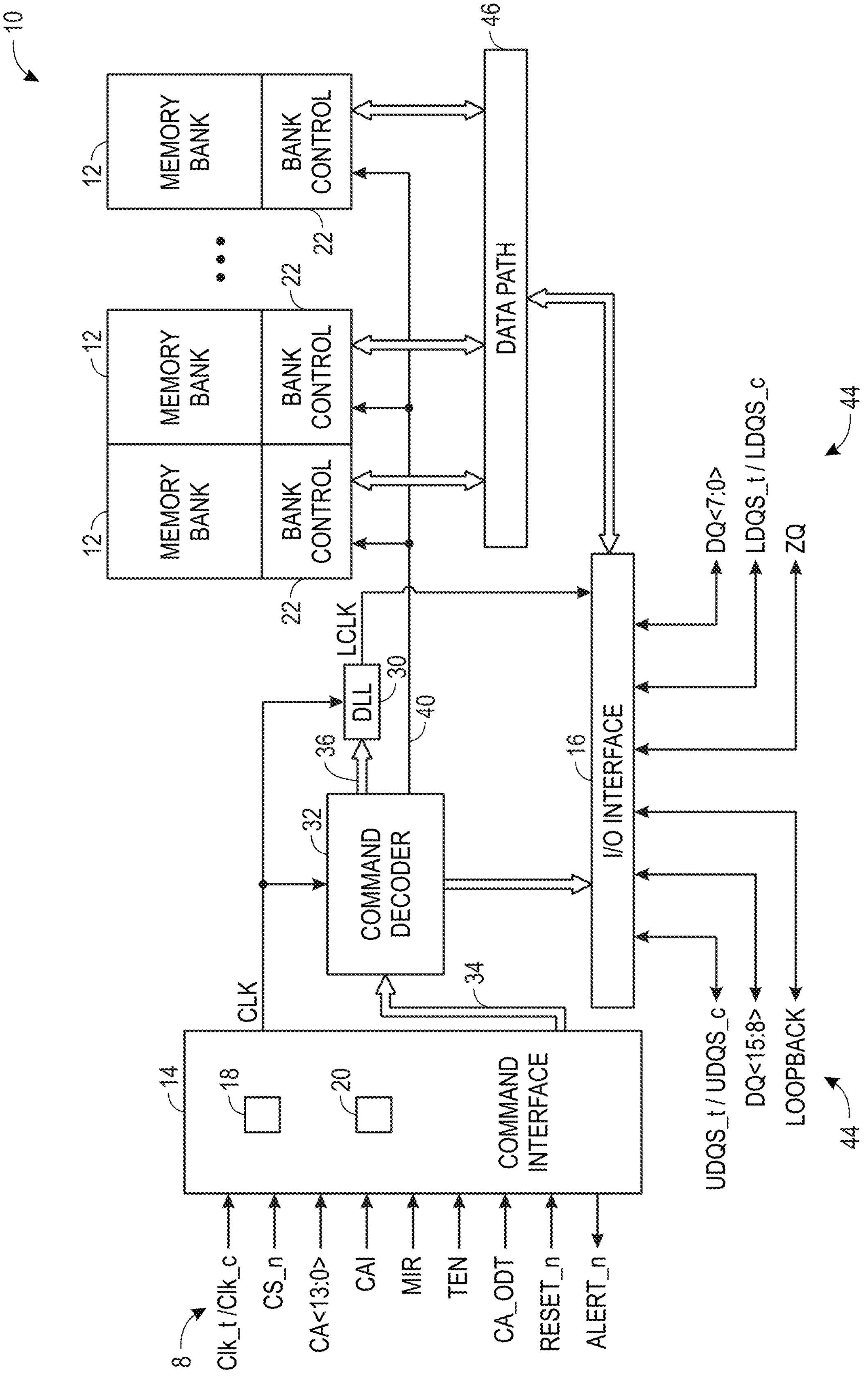
FIG. 1 is a block diagram illustrating certain features of a memory device, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

An electronic device may include a memory device, a processing device, and routing circuitry, among other things. Various circuit components of the electronic device, including the memory components, may provide one or more signals for performing the memory operations. The electronic device may also include one or more voltage generation circuits, such as a voltage regulator, to generate voltages to be sent to a memory array of the memory device to enable some operations of the memory array. The voltage regulator may generate an array voltage (VARY) based on a bias current ($I_{OUT}$) generated by an input circuit. Variations in the bias current ($I_{OUT}$) may affect electrical characteristics of the array voltage (VARY).

In order to achieve consistent transient performance it is desired for the bias current ($I_{OUT}$) to have a higher value while the regulator is in Slow process corners compared to Nominal process corners (e.g., Typical process corners) without also increasing the bias current ($I_{OUT}$) generated while the regulator is in Fast process corners. One problem with adjusting performance of devices (e.g., transistors) in the Slow process corners is that performance of the devices also adjusts in the Fast process corners. Thus, systems and methods that selectively adjust performance in Slow process corners and maintain performance in Fast process corners may be desired. Furthermore, it may be desired that the voltage regulator generate bias currents ($I_{OUT}$) with reduced variance over process and/or temperature changes, which may reduce variance in array voltages (VARY) generated during transient events. Reducing variance in the array voltages (VARY) may enable more accurate design of supplied power to a memory array to power demand of the memory array, which may reduce losses from mismatching power generated to power consumed.

Systems and methods described herein include a bias generator circuit that operates based on two diodes, where the length of the diodes may be selected to generate a desired bias current ($I_{OUT}$). The bias generator circuit may be used to generate bias currents ($I_{OUT}$) with less variance in value over process corner and/or temperature changes while improving or maintaining transient performance in the various process corners. By using the bias generator circuit in conjunction with modified input circuits, voltages sent to the memory array may have improved process and temperature tolerance, improved transient performance in the Slow process corners, reduced current consumption in Fast process corner (relative to similar transient performance), improved mismatch performance, and improved design flexibility, enabling wider applicability in a variety of electronic devices.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous double data rate dynamic random access memory (DDR5 SDRAM) device. Various features of DDR5 SDRAM may permit reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMs). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 8 from an external device (not depicted), such as a processor or controller. The processor or controller may provide various signals 8 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to permit proper handling of the signals 8. The command interface 14 may receive one or more clock signals from an external device. Generally, double data rate (DDR) memory utilizes a differential pair of system clock signals, referred to as the true clock signal (Clk_t) and the complementary clock signal (Clk_c). The positive clock edge for DDR refers to the point where the rising true clock signal (Clk_t) crosses the falling complementary clock signal (Clk_c), while the negative clock edge indicates that transition of the falling true clock signal (Clk_t) and the rising of the complementary clock signal (Clk_c). Commands (e.g., read command, write command, refresh command) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal (CLK). The internal clock signal (CLK) is supplied to an internal clock generator 30, such as a delay locked loop (DLL) circuit. The internal clock generator 30 generates a phase controlled internal locked clock signal (LCLK) based on the received internal clock signal (CLK). The phase controlled internal locked clock signal (LCLK) is supplied to the I/O interface 16, for instance, and is used as a timing signal for determining an output timing of read data.

The internal clock signal (CLK) may also be provided to various other components within the memory device 10 and may be used to generate various additional internal clock signals. For instance, the internal clock signal (CLK) may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal locked clock signal (LCLK). The phase controlled internal locked clock signal (LCLK) may be used to clock data through the I/O interface 16, for instance.

The command decoder 32 may decode commands, such as read commands, write commands, mode-register set commands, activate commands, or the like, and provide access to a particular memory bank 12 corresponding to the command via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other operations, such as timing control and data control, to facilitate the execution of commands to and from the memory banks 12. Collectively, the memory banks 12 and the bank control blocks 22 may be referred to as a memory array.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal causes the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on-die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals (CA<13:0>) on the command/address bus, for instance, depending on the command/address routing for the particular memory device 10. A mirror (MIR) signal may also be provided to facilitate a mirror function. The MIR signal may be used to multiplex signals so that they may be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To permit higher data rates within the memory device 10, certain memory devices, such as DDR memory devices may utilize data strobe signals, generally referred to as data strobe (DQS) signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and on-die termination (ODT) values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. A precision resistor may be coupled between the ZQ pin on the memory device 10 and ground (GND) or low supply voltage (VSS) (GND/VSS) external to the memory device 10. This resistor acts as a reference for adjusting internal on die termination (ODT) and drive strength of I/O pins.

In addition, a loopback signal (LOOPBACK) may be provided to the memory device 10 through the I/O interface 16. The loopback signal may be used during a test or debugging phase to set the memory device 10 into a mode where signals are looped back through the memory device 10 through the same pin. For instance, the loopback signal may be used to set the memory device 10 to test the data output of the memory device 10. Loopback may include both a data and a strobe, or possibly a data pin to provide the data and/or the strobe. This is generally intended to be used to monitor the data captured by the memory device 10 at the I/O interface 16.

Various other components such as power supply circuits (for receiving external high power supply (VDD) and VSS signals), mode registers (to define various modes of programmable operations and configurations), read/write amplifiers (to amplify signals during read/write operations), temperature sensors (for sensing temperatures of the memory device 10), or the like, may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a computing system, desktop computer, laptop computer, pager, cellular phone, personal organizer, portable audio player, control circuit, camera, or the like. The host device may also be a network node, such as a router, server, or client (e.g., one of the previously-described types of computers). The host device may be some other sort of electronic device, such as a (n) copier, scanner, printer, game console, television, set-top video distribution or recording system, cable box, personal digital media player, factory automation system, automotive computer system, medical device, or the like. The terms used to describe these various examples of systems, like many of the other terms used herein, may share some referents and, as such, should not be construed narrowly in virtue of the other items listed.

Thus, the host device may generally be a processor-based device, which may include a processor, such as a microprocessor, that controls the processing of system functions and requests in the host device. Further, any host processor may include multiple processors that share system control. The host processor may be coupled directly or indirectly to additional system elements of the host device, such that the host processor controls the operation of the host device by executing instructions that may be stored within the host device or external to the host device.

As discussed above, data may be written to and read from the memory device 10, such as by the host device, whereby the memory device 10 operates as volatile memory, such as Double Data Rate DRAM (e.g., DDR5 SDRAM). The host device may, in some embodiments, also include separate non-volatile memory, such as read-only memory (ROM), random access memory (RAM), personal computer RAM (PC-RAM), silicon-oxide-nitride-oxide-silicon (SONOS) memory, metal-oxide-nitride-oxide-silicon (MONOS) memory, polysilicon floating gate based memory, and/or other types of flash memory of various architectures (e.g., not-AND (NAND) memory, not-OR (NOR) memory, etc.) as well as other types of memory devices (e.g., storage), such as solid state drives (SSDs), MultimediaMediaCards (MMCs), SecureDigital (SD) cards, CompactFlash (CF) cards, or any other suitable device. Further, it should be appreciated that the host device may include one or more external interfaces, such as Universal Serial Bus (USB), Peripheral Component Interconnect (PCI), PCI Express (PCI-E), Small Computer System Interface (SCSI), Institute of Electrical and Electronics Engineers (IEEE) 1394 (Firewire), or any other suitable interface as well as one or more input devices to permit a user to input data into the host device, such as by using buttons, switching elements, a keyboard, a light pen, a stylus, a mouse, and/or a voice recognition system. The host device may optionally also include an output device, such as a display coupled to the processor and a network interface device, such as a Network Interface Card (NIC), for interfacing with a network, such as the Internet. As will be appreciated, the host device may include many other components, depending on the application of the host device.

The host device may operate to transfer data to the memory device 10 for storage and may read data from the memory device 10 to perform various operations at the host device. Accordingly, to facilitate these data transmissions, in some embodiments, the I/O interface 16 may include a data transceiver that operates to receive and transmit DQ signals to and from the I/O interface 16.

Figure 2:
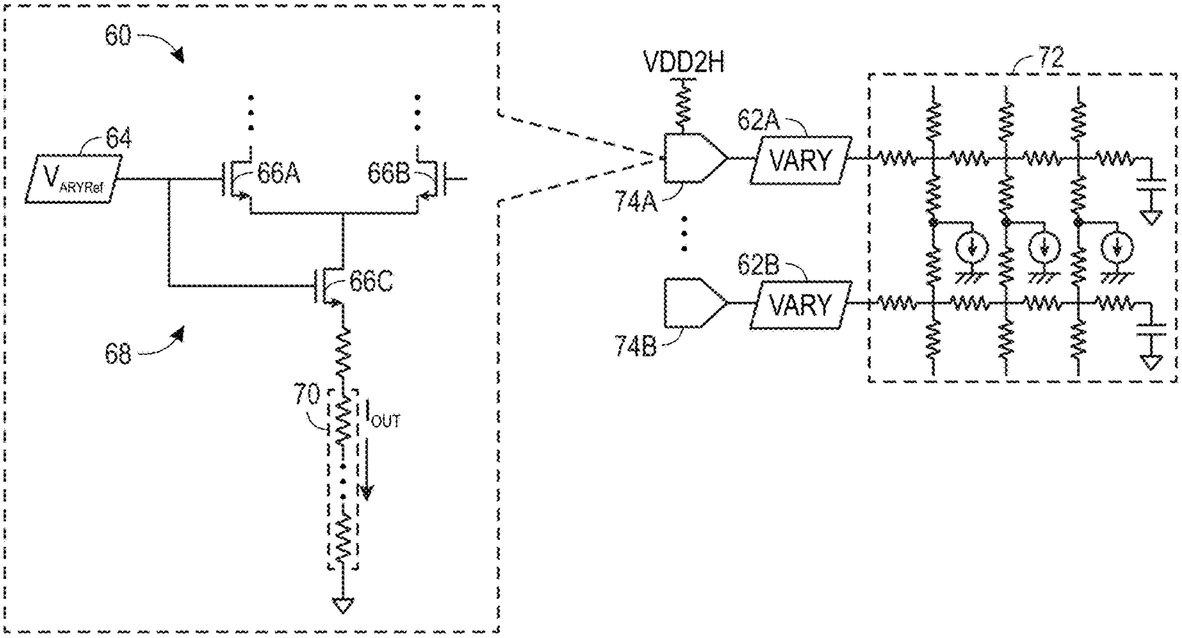
FIG. 2 is a circuit diagram of a first input circuit that may generate an array voltage (VARY) for a memory array shown in the memory device of FIG. 1 based on an array reference voltage (VARYREF), in accordance with an embodiment of the present disclosure.

Keeping the foregoing in mind, FIG. 2 is a circuit diagram of a first input circuit 60 of amplifiers 74. Each of the amplifiers 74 (amplifier 74*a*, amplifier 74*b*) may include a respective first input circuit 60. The first input circuit 60 may generate the array voltage (VARY) 62 based on an array reference voltage (VARYREF) 64, a supply voltage (VDD2H), and one or more transistors 66 (transistor 66A, transistor 66B, transistor 66C). Although the transistors 66 may each be shown as N-channel metal-oxide semiconductors (NMOS) transistors, it should be understood that one or more P-channel MOS (PMOS) transistors or any other suitable type of switch may be used instead one or more of the NMOS transistors.

The amplifiers 74 may be used to generate array voltages (VARY) 62 (array voltage 62*a*, array voltage 62*b*) to be transmitted to a power distribution network (PDN) 72. The power distribution network (PDN) 72 may be modelled based on one or more interconnected resistances, capacitances, and current sources to aid in the delivery of power to one or more portions of a memory array of the memory device 10. The power distribution network (PDN) 72 may be associated with a memory array of the memory banks 12 of FIG. 1. For example, electrical signals supplied to the memory array via the power distribution network (PDN) 72 may enable data storage with the memory array, memory refresh operations of memory cells of the memory array, along with any other suitable operations that occur based on the memory array being delivered power.

One or more amplifiers 74*a* and 74*b* may be placed along one side of a chip of the power distribution network (PDN) 72. In some systems, the power distribution network (PDN) 72 is disposed on a same chip as the memory array and thus the amplifiers 74 may be disposed along an edge of the chip of the memory array. The various amplifiers 74 that include respective first input circuits 60 may generate array voltages (VARY) 62 for distribution to the power distribution network (PDN) 72.

The transistors 66 may be coupled to provide a differential amplifier 68. For example, gates of transistor 66A and transistor 66C may be coupled to receive the array reference voltage (VARYREF) 64. The array reference voltage (VARYREF) 64 and/or the supply voltage (VDD2H) may be supplied from upstream circuits, like power supply circuits or other circuits described relative to FIG. 1. The array reference voltage (VARYREF) 64 may be a voltage signal generated to be constant across process and temperature variations. The array voltage (VARY) 62 may be generated based on a bias current ($I_{OUT}$) transmitted from the differential amplifier 68 via transistor 66C (e.g., the drain of the NMOS transistor 66C). The resultant bias current ($I_{OUT}$) may be proportional in value to changes in temperature and correspond to a value of a difference in the array reference voltage (VARYREF) 64 and a threshold voltage characterizing the transistor 66C divided by a total resistance of resistors 70. The array voltage (VARY) 62 may be transmitted to the power distribution network (PDN) 72.

The resultant bias current ($I_{OUT}$) may vary across process and temperature changes, which may be as high as 60% difference between a Slow process corner and low temperature and between a Fast process corner and high temperature. This variable performance may be undesirable in some memory systems, where load demand varies based on whether a memory is idle (e.g., lower relative load demand), whether a memory access operation is occurring, and whether a memory array refresh operation is occurring (e.g., higher relative load demand).

Figure 3:
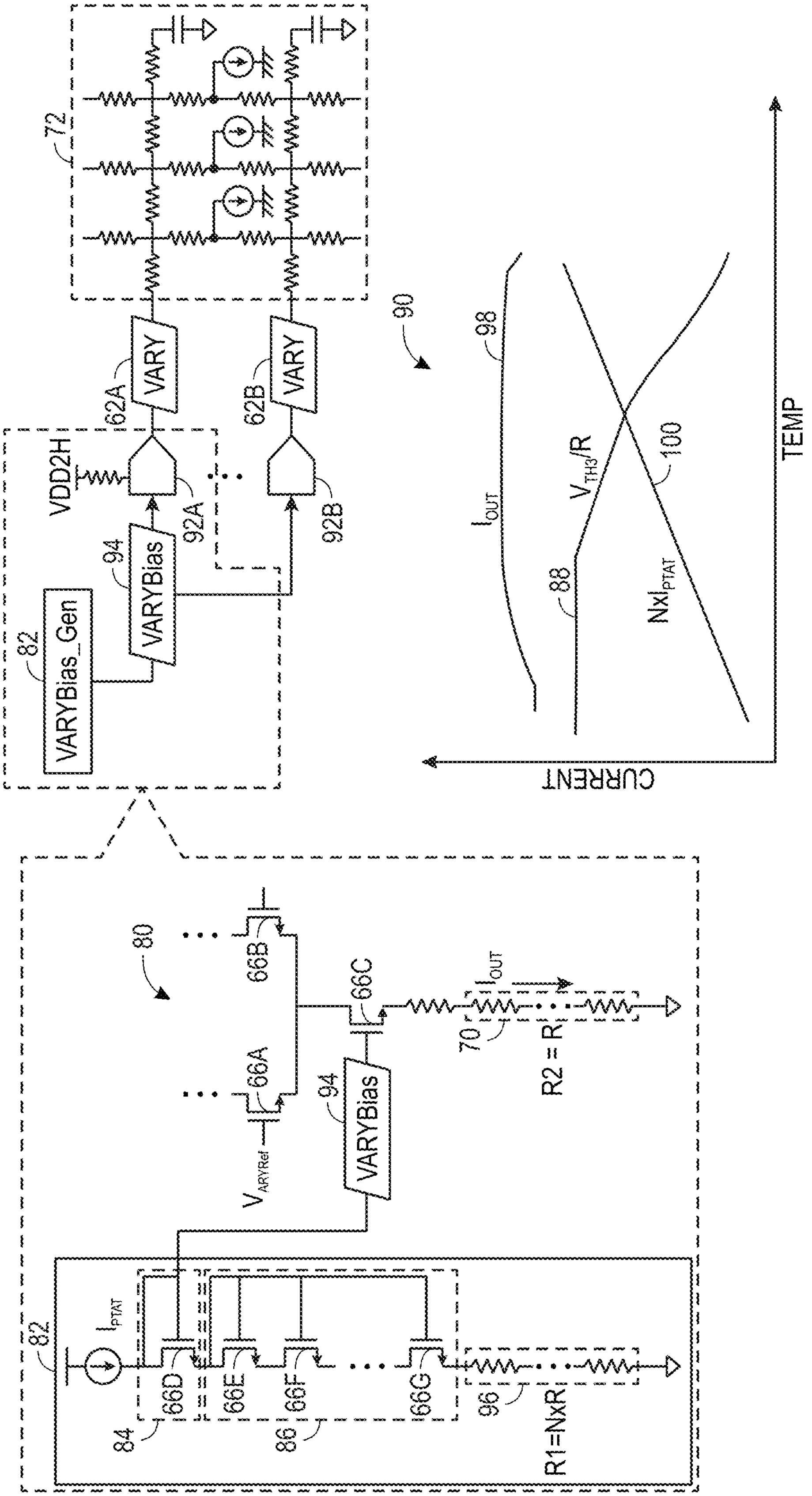
FIG. 3 is a circuit diagram of a first bias generator circuit coupled to a second input circuit that may generate an array voltage (VARY) for a memory array shown in the memory device of FIG. 1 with less variance and improved transient performance relative to the first input circuit of FIG. 2, in accordance with an embodiment of the present disclosure.

To remedy the variable performance, alternative circuits may be used. To elaborate, FIG. 3 is a circuit diagram of a first bias generator circuit 82 coupled to a second input circuit 80. The second input circuit 80 may be an input stage to a respective of amplifiers 92 (amplifier 92*a*, amplifier 92*b*) that generates the array voltage (VARY) 62 for a memory array associated with the memory banks 12 of FIG. 1. The circuitry of FIG. 3 may enable array voltages (VARY) 62 to be generated with less variance and improved transient performance relative to those generated based on the first input circuit 60 of FIG. 2.

Relative to FIG. 2, the bias VARY voltage (VARYbias) 94 is used to generate a resultant bias current ($I_{OUT}$), as opposed to the array reference voltage (VARYREF) 64. A first bias generator circuit 82 may generate the bias VARY voltage (VARYbias) 94 (e.g., bias voltage) based on a first diode 84 and a second diode 86. The amplifiers 92 may each include a respective second input circuit 80 that respectively couple to the first bias generator circuit 82. The amplifiers 92 may respectively generate an array voltage (VARY) 62 based on the (VARYbias) 94 turning on the transistor 66C. The array voltage (VARY) 62 may be sent to a load, like the power distribution network (PDN) 72. The first diode 84 and the second diode 86 may generate a bias VARY voltage (VARYbias) 94 sent as a gate voltage to the transistor 66C. In response to the gate voltage, the transistor 66C transmits a bias current ($I_{OUT}$). A bias current ($I_{OUT}$) of FIG. 3 may experience reduced transients and variation among different process corners and temperatures, which may improve performance of the power distribution network (PDN) 72 and/or other downstream circuits.

To elaborate, the first diode 84 may transmit currents based on a negative temperature coefficient. The negative temperature coefficient may be constant for the first diode 84 and may correspond to the first diode 84 transmitting currents change in value inversely to changes in temperature. For example, as a temperature of the diode 84 decreases, a current transmitted via the diode 84 increases. The first diode 84 may be characterized by a first threshold voltage of the transistor 66D. The threshold voltage characterizing the transistor 66D may equal or be within a threshold range from a threshold voltage characterizing the transistor 66C, where the threshold range may correspond to a percentage of difference, like within 1% difference threshold from the threshold voltage of the transistor 66C, 2% difference threshold from the threshold voltage of the transistor 66C, or the like. The difference threshold may be zero or negligibly different for the system.

The second diode 86 may include one or more of the transistors 66 (e.g., transistor 66E, transistor 66F, transistor 66G, and so on) coupled in series. Each of the transistors 66E, 66F, and 66G may be characterized by a threshold voltage that together correspond to a threshold voltage of the second diode 86. The threshold voltage of the second diode 86 may be different from the threshold voltage of the first diode 84. The length of the second diode 86 corresponds to a number of the transistors 66 coupled in series. As transistors 66 are added or removed from the second diode 86, the temperature coefficient of the second diode 86 changes. Thus, the temperature coefficient of the second diode 86 is based on the length of the second diode 86. The temperature coefficient of the second diode 86 may remain negative and the changes in value of the temperature coefficient may affect a slope of line 88 in inset plot 90. To elaborate, the inset plot 90 illustrates an example of the bias current ($I_{OUT}$) generated based on the first bias generator circuit 82 and the second input circuit 80 with line 98. The inset plot 90 includes an illustration of a contribution to the value of the bias current ($I_{OUT}$) from a proportional to absolute temperature (PTAT) current via line 100. The inset plot 90 includes an illustration of a contribution to the value of the bias current ($I_{OUT}$) from a complementary to absolute temperature (CTAT) current via line 88. Over the changes in temperature, as generally illustrated in inset plot 90, the two different components of the value of the bias current ($I_{OUT}$) combine to compensate for the variances over temperature of each respective component such that the overall performance of bias current ($I_{OUT}$) is relatively less variable over the changes in temperature.

To elaborate further, the bias current ($I_{OUT}$) may be a temperature compensated current generated by a combination of a proportional to absolute temperature (PTAT) current and a complementary to absolute temperature (CTAT) current. The resultant bias current ($I_{OUT}$) may be temperature independent and follow a relationship of Equation 1.

$$I_{out} = N * I_{PTAT} + \frac{V_{TH3}}{R2} \quad [1]$$

Equation 1 may illustrate an example relationship between a bias current ($I_{OUT}$) generated based on first bias generator circuit 82 and the second input circuit 80 and between various resistances of the circuits. In Equation 1, a relationship (N) of the total resistance of resistors 96 (R1) and a total resistance of resistors 70 (R2), where the relationship may correspond to a quotient of R1 and R2 (e.g., N=R1/R2). $V_{TH3}$ may be a threshold voltage of the diode 86, which may be based on one or more threshold voltages of the transistors 66E, 66F, and 66G. A proportional to absolute temperature (PTAT) current contribution may correspond to the $N*I_{PTAT}$ term of relationship shown via Equation 1. A complementary to absolute temperature (CTAT) current may corresponding to the $$\frac{V_{TH3}}{R2}$$

term of relationship shown via Equation 1 below. The CTAT current may be generated based on a relationship between the threshold voltage ($V_{TH}$) of the transistors 66C (e.g., $V_{TH3}$) and the total resistance (R2) of resistors 70. When a Typical process corner temperature-slope is kept as zero, Fast and Slow process corners may show opposite temperature-dependency when analyzing the bias current ($I_{OUT}$) behavior further. If an absolute current value is desired to be changed, adjustments can be made to the resistance quotient value (e.g., N).

It is noted that the amplifiers 92 may respectively include resistors 70, which may represent one or more resistances coupled in series. A first resistor of the resistors 70 may couple to a drain of the transistor 66C. The transistor 66C may transmit the bias current ($I_{OUT}$) while turned on. The bias current ($I_{OUT}$), as noted above, may include a proportional to absolute temperature (PTAT) current and a complementary to absolute temperature (CTAT) current, and thus may include a temperature and process corner compensated current.

A length of the diode 86 may be changed to compensate for changes in the bias current ($I_{OUT}$) over changes in temperature and process corners. The length of the diode 86 may be greater than the length of the diode 84. The length of the diode 86 may correspond to a temperature coefficient of the bias current ($I_{OUT}$). To elaborate, as the length of the diode 86 changes, such as when one or more transistors 66 are added or removed from the diode 86, the value of $V_{TH3}$ may change. As $V_{TH3}$ changes, a slope of the CTAT current portion of the relationship exemplified by Equation 1 (e.g., the $$\frac{V_{TH3}}{R2}$$

term) changes. This relationship between the length of the diode 86 and the resultant characteristics of the bias current ($I_{OUT}$) may be leveraged to compensate for the bias current ($I_{OUT}$) changes over temperature and process. By adjusting a length of the diode 86, the bias current ($I_{OUT}$) may be compensated for changes in process and/or based on expected loading of the power distribution network (PDN) 72. Supplying compensated VARY voltages to the power distribution network (PDN) 72 may experience better generation-consumption matching, reducing inefficiencies from mismatch, and enabling the other benefits described herein.

Figure 4:
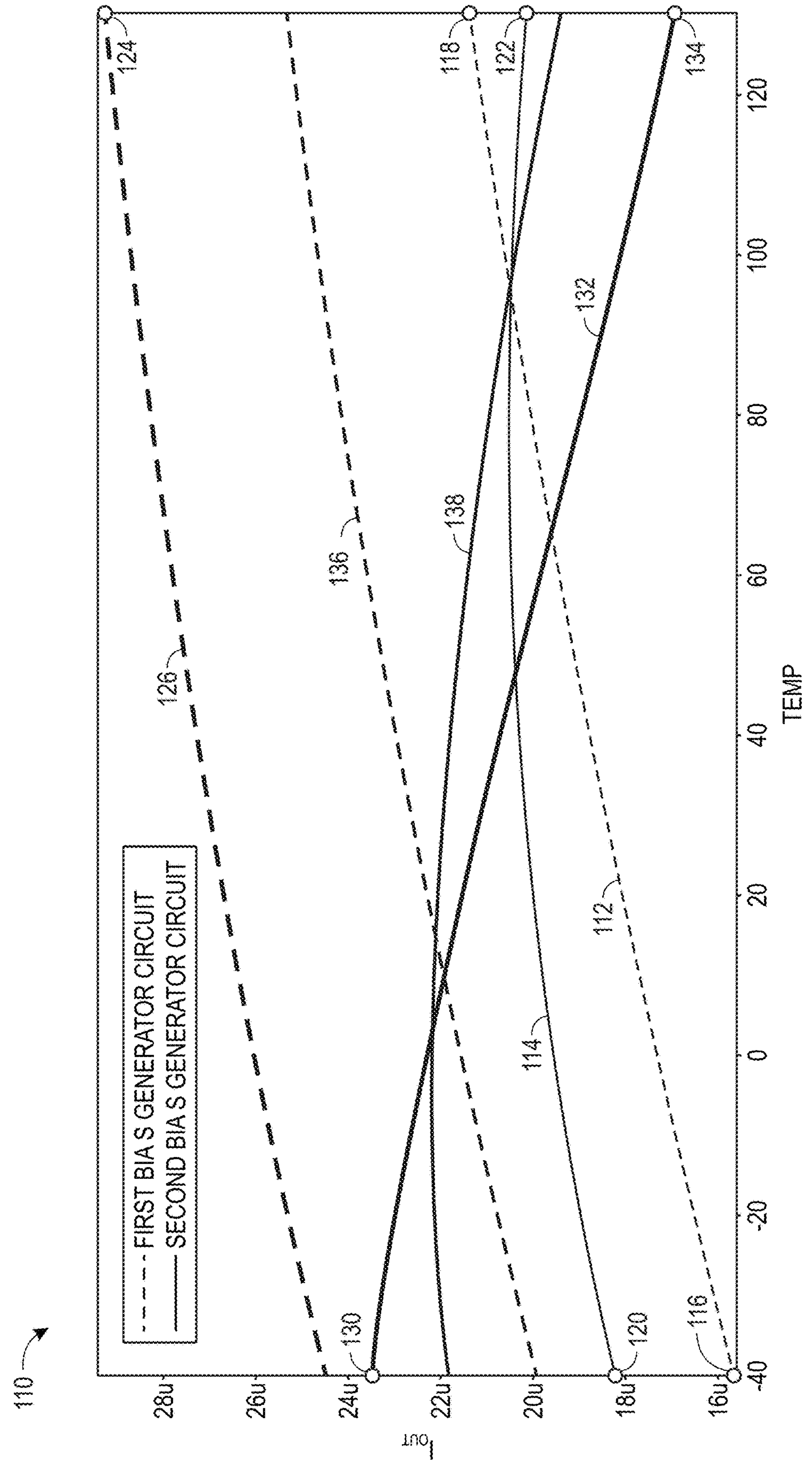
FIG. 4 is a plot of simulated bias currents ($I_{OUT}$) over temperature generated by modelling the first bias generator circuit and the second input circuit of FIG. 3 compared to simulated bias currents ($I_{OUT}$) over temperature generated by modelling the first input circuit of FIG. 2, in accordance with an embodiment of the present disclosure.

FIG. 4 is a plot 110 of simulated bias currents ($I_{OUT}$) generated by modelling the first bias generator circuit 82 and the second input circuit 80 of FIG. 3 compared to simulated bias currents ($I_{OUT}$) generated by modelling the first input circuit 60 of FIG. 2. In this simulation, currents were modelled over different temperatures (ranging from −40 degrees Celsius (C) to 130 C) and for different process corners (e.g., Slow process corner, Typical process corner, Fast process corner).

Indeed, line 112 corresponds to a simulation corresponding to the first input circuit 60 of FIG. 2 being operated to generate bias current ($I_{OUT}$) at temperatures between −40 C and 130 C while in a Slow process corner. Line 136 corresponds to a simulation corresponding to the first input circuit 60 of FIG. 2 being operated to generate bias current ($I_{OUT}$) at temperatures between −40 C and 130 C while in a Typical process corner. Line 126 corresponds to a simulation corresponding to the first input circuit 60 of FIG. 2 being operated to generate bias current ($I_{OUT}$) at temperatures between −40 C and 130 C while in a Fast process corner. Line 114 corresponds to a simulation corresponding to the first bias generator circuit 82 and the second input circuit 80 of FIG. 3 being operated to generate bias current ($I_{OUT}$) at temperatures between −40 C and 130 C while in a Slow process corner. Line 138 corresponds to a simulation corresponding to the first bias generator circuit 82 and the second input circuit 80 of FIG. 3 being operated to generate bias current ($I_{OUT}$) at temperatures between −40 C and 130 C while in a Typical process corner. Line 132 corresponds to a simulation corresponding to the first bias generator circuit 82 and the second input circuit 80 of FIG. 3 being operated to generate bias current ($I_{OUT}$) at temperatures between −40 C and 130 C while in a Fast process corner.

By using systems and methods described relative to FIG. 3, performance may be improved relative to systems and methods described with FIG. 2. Indeed, the bias current ($I_{OUT}$) represented via the line 112 varied in values from value 116 to value 118. Value 116 equals approximately 15.7 microamps (uA) at −40 C and value 118 equals approximately 21.4 uA at 130 C, which amounts to approximately a 5.7 uA variance over the changes in temperature. The bias current ($I_{OUT}$) represented via the line 114 varied in values from value 120 to value 122. Value 120 equals approximately 18.3 uA and value 122 equals approximately 20.1 uA, which amounts to approximately a 1.8 uA variance over the changes in temperature. Thus, by using systems and methods of FIG. 3, current variance over temperature changes may reduce.

Variance from process changes may reduce as well. For example, value 116 of line 112 (e.g., −40 C and Slow process corner) may equal approximately 15.7 uA and value 124 of line 126 (e.g., 130 C and Fast process corner) may equal approximately 29.3 uA, where a difference between values 116 and 124 may equal approximately 13.6 uA (e.g., approximately 60% of Typical performance at 25 C). Value 130 (e.g., −40 C and Fast process corner) of line 132 may equal approximately 23.5 uA and value 134 (e.g., 130 C and Fast process corner) may equal approximately 16.5 uA, where a difference between values 116 and 124 may equal approximately 7 uA (e.g., approximately 32% of Typical process corner performance at 25 C). Since 7 uA of simulated difference is less than 13.6 uA of simulated difference, current variance over process and temperature changes may be reduce based on the systems and methods of FIG. 3. Indeed, the proposed systems and methods of FIG. 3 may sometimes provide at least a 2× improvement in bias current ($I_{OUT}$) variation from systems and methods of FIG. 2 across process and temperature corners.

Figure 5:
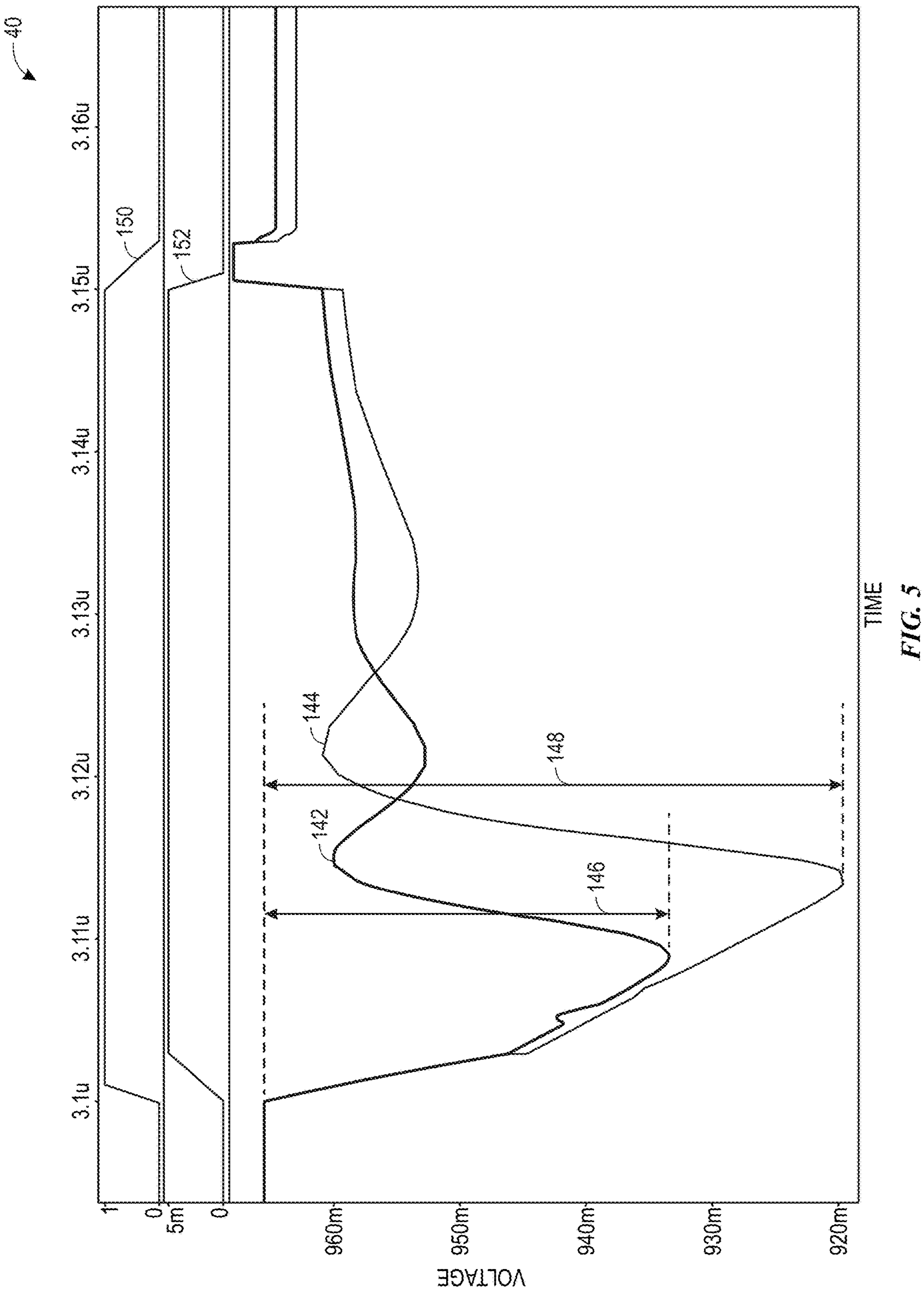
FIG. 5 is a plot of, for a Slow process corner at −40 degree Celsius (C), a simulated bias current ($I_{OUT}$) over time generated by modelling the first bias generator circuit and the second input circuit of FIG. 3 compared to a simulated bias current ($I_{OUT}$) over time generated by modelling the first input circuit of FIG. 2, in accordance with an embodiment of the present disclosure.

Additional improvements may manifest in transient responses of the bias currents ($I_{OUT}$) to load changes, which may occur when a change in memory operation occurs. To elaborate, FIG. 5 is a plot 140 of voltages over time corresponding to simulated bias currents ($I_{OUT}$). Line 150 illustrates a change in voltage over time from an example modelled amplifier 74, 92 receiving a number to store in the memory array. Line 152 illustrates a change in voltage over time from modelling the memory array as a load of the amplifiers 74, 92. Lines 142 and 144 illustrate a change in voltage over time in the output from the amplifiers 74, 92 that settles down and converges to a voltage output over time. The line 142 may correspond to modelling the first bias generator circuit 82 and the second input circuit 80 of FIG. 3 and thus correspond to an output from the amplifier **92*a*. The line 144 may correspond to modelling the first input circuit 60 of FIG. 2 and thus correspond to an output from the amplifier 74*a*. Voltage difference 146 corresponds to a voltage that is approximately 35% less than a voltage of voltage difference 148, which illustrates that the first bias generator circuit 82 and the second input circuit 80 of FIG. 3 may have a faster transient response than the first input circuit 60 of FIG. 2. Although these transient results correspond to Slow process corner performance improvements, it should be understood that similar modelling of circuits of FIGS. 2-3** in Fast process corner at 130 C illustrate that transient performance is maintained within tolerable ranges despite the changes to transient performance in Slow process corner at −40 C.

Figure 6:
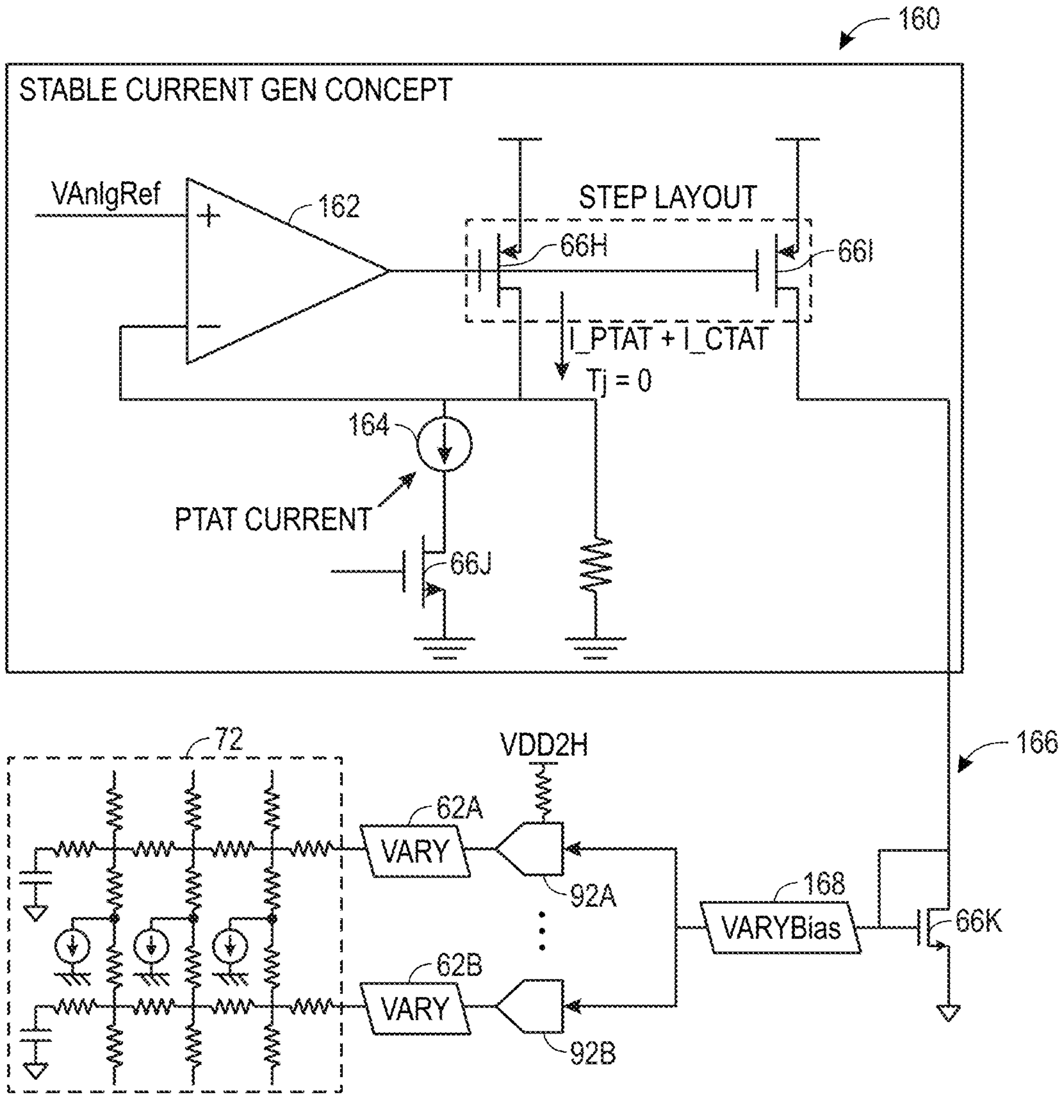
FIG. 6 is a block diagram illustrating a second bias generator circuit coupled to the second input circuit of FIG. 3, in accordance with an embodiment of the present disclosure.

In some systems, an alternative bias generator circuit may be used. FIG. 6 is a block diagram illustrating a second bias generator circuit 160 coupled to the second input circuit 80 of FIG. 3, where the second bias generator circuit 160 may generate the bias current ($I_{OUT}$) as tail currents inside amplifiers **92*a* and 92*b*. The second bias generator circuit 160 may include an amplifier 162, a current source 164, and one or more of the transistors 66 (a transistor 66H, a transistor 66I, a transistor 66J, a transistor 66K). A CTAT current based on a voltage ($V_{AnglRef}$) may be supplied to a positive input of the amplifier 162. The amplifier 162 may receive another voltage at a negative input from a feedback loop path based on a current from the current source 164, which may be a PTAT current. A resulting current may be a process and temperature compensated current ($I_{STABLE}$) provided to a diode 166 (e.g., formed from transistor 66K). A bias voltage (VARYBias) 168 may be generated based on the diode 166 and the compensated current ($I_{STABLE}$). The bias voltage (VARYBias) 168 may be routed across the chip to generate a tail current inside one or more amplifiers 92*a* and 92*b*. The amplifiers 92*a* and 92*b* may correspond to the amplifiers 92*a* and 92*b* from FIG. 3, and thus may include similar input circuits as input circuit 80. Similar to circuits of FIG. 2 and FIG. 3, the amplifiers 92*a* and 92*b* may generate array voltages (VARY) 62*a* and 62*b* for the power distribution network (PDN) 72**.

A difference in threshold voltage ($\Delta V_{TH}$) mismatch between source and mirror device may play a large role in output current sensitivity and may use a gate overdrive to minimize an effect of the mismatch. Indeed, comparing systems of FIG. 3 to systems of FIG. 6, the first bias generator circuit 82 and the second input circuit 80 of FIG. 3 may generate a bias current ($I_{OUT}$) that has a value based on a relationship where a threshold voltage ($\Delta V_{TH}$) mismatch contributes a lesser amount to the overall bias current ($I_{OUT}$) value when compared to the amount that a threshold voltage ($\Delta V_{TH}$) mismatch contributes to the value of a bias current ($I_{OUT}$) generated based on the second bias generator circuit 160 of FIG. 6. Furthermore, the first bias generator circuit 82 and the second input circuit 80 of FIG. 3 may have a smaller footprint relative to the second bias generator circuit 160 of FIG. 6.

Although the second bias generator circuit 160 may be used to generate a bias current ($I_{OUT}$), doing so may increase complexity and footprint of bias generator circuitry relative to the systems and methods described above relative to FIGS. 3-5. Furthermore, systems illustrated in FIG. 6 may impact mismatch performance, which may be undesirable in some memory devices 10.

Other methods may include per-die trimming. However, testing of circuits based on per-die trimming was be expensive from space and time perspective. Per-die trimming may involve controlling the bias current ($I_{OUT}$) for each memory die. An addition of a bias control tap bit to adjust the bias current ($I_{OUT}$) may enable Slow process corner monitoring of a supply current (IDD). Per-die trimming methods and/or systems and methods of FIG. 6 may be less ideal for memory array systems. For example, the systems and methods of FIG. 3 may be based on a single branch with available PTAT current source and use less area (e.g., has a smaller footprint relative to per-die trimming and/or FIG. 6 systems). Furthermore, systems and methods of FIG. 3 may increase design flexibility via increasing a number of metal options able to be used to compensate for process and temperature variation and to adjust absolute current value.

Systems and methods described herein include a bias generator circuit able to generate a bias current at least partially compensated for process corner and temperature changes. Indeed, a memory array of the memory device may be powered via a power distribution network. Over time, loading of voltage regulators may change based on demand of the power distribution network. By including a bias voltage generator to supply the voltage regulators with a compensated bias current, voltages generated by the voltage regulators may be better compensated over temperature and/or process changes. Voltage regulators that generate relatively more compensated voltages may be more accurate with output voltages relative to setpoint voltages, and thus may improve in its matching of power supplied to power consumed by the power distribution network.

The bias generator circuit may have two or more diodes of different lengths, which may correspond to different temperature coefficients enabling selective design of the bias current in the various temperature and process corners. By using the bias generator circuit, a voltage regulator may generate improved array voltages (VARY) to be provisioned to a power distribution network (PDN) of a memory array based on the bias current ($I_{OUT}$) generated by the bias generator circuit. Thus, the bias generator circuit systems and methods may be used in conjunction with modified input circuits to cause generation of less variable array voltages (VARY), which may improve mismatches between array voltage (VARY) generation and consumption.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform] ing [a function] . . . " or "step for [perform] ing [a function] . . . ", it is intended that such elements are to be interpreted under 35 U.S.C. 112 (f). However, for any claims containing elements designated in any other manner, it is intended that such elements are not to be interpreted under 35 U.S.C. 112 (f).

What is claimed is:

1. A memory device comprising:
- a bias generator configured to generate a bias voltage, wherein the bias generator comprises:
  - a first diode characterized by a first threshold voltage; and
  - a second diode characterized by a second threshold voltage different from the first threshold voltage, wherein the second diode is characterized by a first length greater than a second length characterizing the first diode;
- an amplifier coupled to a transistor having a gate coupled to the bias generator, wherein the amplifier is configured to generate an array voltage based on the transistor turning on, wherein the transistor is characterized by a third threshold voltage, and wherein the first threshold voltage equals the third threshold voltage; and
- a load configured to receive the array voltage.

2. The memory device of claim 1, wherein the amplifier comprises a resistance coupled to a source of the transistor that transmits a bias voltage while the transistor is turned on.

3. The memory device of claim 2, wherein the bias voltage comprises a proportional to absolute temperature (PTAT) voltage and a complementary to absolute temperature (CTAT) voltage.

4. The memory device of claim 2, wherein a temperature and process corner compensated current is generated based on the bias voltage.

5. The memory device of claim 1, wherein the first length corresponds to a temperature coefficient.

6. The memory device of claim 1, wherein the load comprises a power distribution network associated with a memory array, and wherein the power distribution network is configured to receive the array voltage and enable operation of the memory array based on the array voltage.

7. The memory device of claim 6, comprising a plurality of amplifiers comprising the amplifier, wherein the plurality of amplifiers are disposed on a chip along one side of the memory array.

8. The memory device of claim 7, wherein each amplifier of the plurality of amplifiers are coupled to the bias generator.

9. A circuit comprising:
- an amplifier comprising:
  - a bias generator configured to generate a bias voltage, wherein the bias generator comprises:
    - a first diode characterized by a first threshold voltage; and
    - a second diode characterized by a second threshold voltage different from the first threshold voltage, wherein the second diode is characterized by a first length greater than a second length characterizing the first diode; and
  - an input stage comprising a first transistor coupled to the bias generator, wherein the amplifier is configured to generate an array voltage based on the first transistor turning on, wherein the first transistor is characterized by a third threshold voltage, and wherein the first threshold voltage equals the third threshold voltage; and
- a memory array configured to receive the array voltage.

10. The circuit of claim 9, wherein the bias generator comprises:

as the first diode, a second transistor;

as the second diode, a plurality of transistors respectively coupled to each other in series; and a first plurality of resistors coupled to a drain of a third transistor of the plurality of transistors.

11. The circuit of claim 10, wherein the amplifier comprises:

the first transistor coupled, via a first gate, to a second gate of the second transistor; and a second plurality of resistors coupled to a second drain of the first transistor.

12. The circuit of claim 11, wherein the second plurality of resistors transmit a bias current to the memory array while the first transistor is turned on, and wherein the bias current comprises temperature and process corner compensated current.

13. The circuit of claim 12, wherein the first length corresponds to a temperature coefficient associated with the bias current.

14. A circuit comprising:

a first transistor characterized by a first threshold voltage;

a plurality of transistors respectively coupled to each other in series, wherein the plurality of transistors is characterized by a second threshold voltage different from the first threshold voltage, wherein the plurality of transistors is characterized by a first length greater than a second length characterizing the first transistor;

a first plurality of resistors coupled to a drain of a second transistor of the plurality of transistors;

a third transistor coupled, via a first gate, to a second gate of the first transistor, wherein the third transistor is characterized by a third threshold voltage, and wherein a value of the first threshold voltage is within a difference threshold from a value of the third threshold voltage; and a second plurality of resistors coupled to a source of the third transistor and configured to couple to a power distribution network of a memory array.

15. The circuit of claim 14, wherein the difference threshold equals zero.

16. The circuit of claim 14, wherein an amplifier comprises an input stage, wherein the input stage comprises the second plurality of resistors, and wherein the amplifier is configured to transmit a bias voltage to the power distribution network while the third transistor is turned on.

17. The circuit of claim 16, wherein a temperature and process corner compensated current is generated based on the bias voltage.

18. The circuit of claim 14, wherein the first transistor corresponds to a first diode, wherein the plurality of transistors corresponds to a second diode, and wherein the plurality of transistors comprises three transistors.

19. The memory device of claim 1, comprising a memory controller.

20. The circuit of claim 14, comprising the power distribution network of the memory array.

* * * * *